United States Patent
Dong et al.

(10) Patent No.: US 11,432,432 B2
(45) Date of Patent: Aug. 30, 2022

(54) HEAT DISSIPATION APPARATUS, HEAT DISSIPATOR, ELECTRONIC DEVICE, AND HEAT DISSIPATION CONTROL METHOD

(71) Applicant: HUAWEI TECHNOLOGIES CO., LTD., Guangdong (CN)

(72) Inventors: Ying Dong, Chengdu (CN); Weifeng Hu, Shanghai (CN); Binghua Li, Xi'an (CN); Jibin Zhou, Xi'an (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 21 days.

(21) Appl. No.: 16/663,567

(22) Filed: Oct. 25, 2019

(65) Prior Publication Data
US 2020/0060045 A1   Feb. 20, 2020

Related U.S. Application Data (63) Continuation of application No. PCT/CN2017/117751, filed on Dec. 21, 2017.

(30) Foreign Application Priority Data

Apr. 28, 2017   (CN) .......................... 201710296123.8

(51) Int. Cl.
H05K 7/20   (2006.01)

(52) U.S. Cl.
CPC ..... *H05K 7/20436* (2013.01); *H05K 7/20509* (2013.01)

(58) Field of Classification Search
CPC .. G06F 1/20; G06F 1/206; H05K 7/20; H05K 7/20127; H05K 7/20136; H05K 7/20436;
(Continued)

(56) References Cited

U.S. PATENT DOCUMENTS 4,279,292 A * 7/1981 Swiatosz ............... F24F 5/0042
165/61
4,621,304 A * 11/1986 Oogaki ............... H01L 23/4006
165/185
(Continued)

FOREIGN PATENT DOCUMENTS

CN   1307258   8/2001
CN   1955837   5/2007
(Continued)

OTHER PUBLICATIONS

International Search Report for PCT/CN2017/117751 dated Mar. 21, 2018, 6 pages.

*Primary Examiner* — Adam B Dravininkas (57) ABSTRACT

A heat dissipation apparatus is provided, an electronic component is disposed on one side of an adjustable heat dissipation component, and a rotating shaft is disposed on another side of the adjustable heat dissipation component; and one end of a connecting component is connected to the adjustable heat dissipation component, another end of the connecting component is connected to a fixed substrate, and the connecting component drives the adjustable heat dissipation component to rotate by using the rotating shaft. The connecting component may be adjusted to rotate the electronic component together with the adjustable heat dissipation component, to reduce complexity in deploying the electronic component and the heat dissipation apparatus without affecting a heat dissipation effect, thereby improving convenience of operation.

19 Claims, 5 Drawing Sheets

(58) Field of Classification Search
CPC ............. H05K 7/20509; H05K 7/2039; H05K 7/20954; H01L 23/3672
See application file for complete search history.

(56) References Cited

U.S. PATENT DOCUMENTS

| | | | | |
|---|---|---|---|---|
| 4,770,242 | A * | 9/1988 | Daikoku | H01L 23/4338 165/185 |
| 5,923,179 | A * | 7/1999 | Taylor | G01R 1/0458 324/750.1 |
| 6,166,906 | A * | 12/2000 | Sun | H01L 23/427 165/104.33 |
| 6,318,451 | B1 | 11/2001 | Lee et al. | |
| 6,447,322 | B1 * | 9/2002 | Yan | G01R 1/0458 361/709 |
| 7,036,574 | B2 * | 5/2006 | Thompson | F28D 15/0233 165/185 |
| 7,327,568 | B2 | 2/2008 | Lin | |
| 7,537,049 | B2 * | 5/2009 | Cheng | F28D 15/0266 165/104.21 |
| 7,806,531 | B2 | 10/2010 | Zakoji et al. | |
| 8,322,405 | B2 * | 12/2012 | Tang | H01L 23/467 165/80.3 |
| 9,863,717 | B2 * | 1/2018 | Joist | F28F 5/00 |
| 9,912,107 | B2 * | 3/2018 | Bucher | H01R 12/716 |
| 2005/0074995 | A1 * | 4/2005 | Kimura | H05K 5/0295 439/159 |
| 2005/0248918 | A1 | 11/2005 | Lin | |
| 2007/0008702 | A1 * | 1/2007 | Chang | F28F 1/20 361/703 |
| 2007/0091276 | A1 * | 4/2007 | Zakoji | G03B 21/16 353/54 |
| 2009/0205807 | A1 * | 8/2009 | Kim | F28F 5/00 165/80.3 |
| 2010/0307718 | A1 * | 12/2010 | Chen | F28F 1/32 165/104.26 |
| 2011/0110040 | A1 * | 5/2011 | Liu | H01L 23/427 361/696 |
| 2012/0113586 | A1 * | 5/2012 | Rau | H01L 23/473 361/679.47 |
| 2012/0293952 | A1 * | 11/2012 | Herring | H01L 23/367 361/679.54 |
| 2013/0027873 | A1 * | 1/2013 | Chen | G06F 1/203 361/679.46 |
| 2013/0235529 | A1 * | 9/2013 | Yang | H01L 23/4338 361/704 |
| 2014/0210072 | A1 * | 7/2014 | Tsukamoto | H01L 23/367 257/717 |
| 2016/0178289 | A1 * | 6/2016 | Gonzalez | H01L 23/3675 165/80.3 |
| 2017/0105316 | A1 * | 4/2017 | Lin | H01L 23/4093 |

FOREIGN PATENT DOCUMENTS

| | | |
|---|---|---|
| CN | 101331817 A | 12/2008 |
| CN | 101908513 | 12/2010 |
| CN | 102905506 A | 1/2013 |
| CN | 103687423 A | 3/2014 |
| CN | 204145981 U | 2/2015 |
| CN | 104808756 | 7/2015 |
| CN | 205229959 U | 5/2016 |
| CN | 205521138 U | 8/2016 |
| CN | 205812134 | 12/2016 |
| CN | 107087377 | 8/2017 |
| TW | 200538021 | 11/2005 |

* cited by examiner

| When a first acting force is received by using a connecting component, control an adjustable heat dissipation component to rotate in a first direction by using a rotating shaft, so that a distance between one end of the adjustable heat dissipation component and a fixed substrate is increased | 101 |

↓

| When a second acting force is received by using the connecting component, control the adjustable heat dissipation component to rotate in a second direction by using the rotating shaft, so that the distance between the one end of the adjustable heat dissipation component and the fixed substrate is decreased | 102 |

FIG. 7

HEAT DISSIPATION APPARATUS, HEAT DISSIPATOR, ELECTRONIC DEVICE, AND HEAT DISSIPATION CONTROL METHOD

CROSS-REFERENCE TO RELATED APPLICATIONS

This application is a continuation of International Application No. PCT/CN2017/117751, filed on Dec. 21, 2017, which claims priority to Chinese Patent Application No. 201710296123.8, filed on Apr. 28, 2017. The disclosures of the aforementioned applications are hereby incorporated by reference in their entireties.

TECHNICAL FIELD

This application relates to the field of electronic devices, and in particular, to a heat dissipation apparatus, a heat dissipator, an electronic device, and a heat dissipation control method.

BACKGROUND

With development of integration technologies and microelectronics technologies, electronic components are more widely applied. However, an electronic component generates heat during operation. A temperature of the electronic component also increases constantly as the heat accumulates, affecting performance and reliability of the electronic component.

To control the temperature of the electronic component within a proper temperature range, a heat dissipator is usually fixed onto a surface of the electronic component, and a fin on the heat dissipator is used to dissipate the heat outwards, to reduce the temperature of the electronic component. Some electronic devices, for example, an antenna, further need a wider radiation range. In this case, an installation mode of an electronic component in this type of electronic device needs to be adjusted, to expand a radiation range.

However, when the installation mode of the electronic component is adjusted, because a surface of the electronic component is fixedly connected to a heat dissipator, an installation mode of the heat dissipator also needs to be adjusted in time as the installation mode of the electronic component changes. This increases complexity in deploying the electronic component and the heat dissipator, and results in inconvenience of operation.

SUMMARY

Embodiments of this application provide a heat dissipation apparatus, a heat dissipator, an electronic device, and a heat dissipation control method, where a connecting component may be adjusted to rotate an electronic component together with an adjustable heat dissipation component, to reduce complexity in deploying the electronic component and the heat dissipation apparatus without affecting a heat dissipation effect, thereby improving convenience of operation.

According to a first aspect, an embodiment of this application provides a heat dissipation apparatus, including: an adjustable heat dissipation component, a fixed substrate, a rotating shaft, and a connecting component, where an electronic component is disposed on one side of the adjustable heat dissipation component, and the rotating shaft is disposed on another side of the adjustable heat dissipation component. The rotating shaft is also referred to as a mechanical shaft, and performs connection and rotation functions. One end of the connecting component is connected to the adjustable heat dissipation component, and another end of the connecting component is connected to the fixed substrate. This structure enables the connecting component to drive the adjustable heat dissipation component to rotate by using the rotating shaft. It can be understood that the adjustable heat dissipation component is mainly used to decrease a temperature of the electronic component during operation, and the electronic component is fixedly connected to the adjustable heat dissipation component. In other words, a contact surface between the electronic component and the adjustable heat dissipation component is also fixed. The contact surface between the electronic component and the adjustable heat dissipation component may need to be maximized, to achieve a better heat dissipation effect. The connecting component acts as a "bridge", and is configured to connect the adjustable heat dissipation component and the fixed substrate, where the fixed substrate is relatively stationary. An angle of the adjustable heat dissipation component may be adjusted, thereby improving flexibility of the heat dissipation apparatus in use.

In this embodiment of this application, the heat dissipation apparatus is provided. The heat dissipation apparatus includes the adjustable heat dissipation component, the fixed substrate, the rotating shaft, and the connecting component. The electronic component is disposed on one side of the adjustable heat dissipation component, and the rotating shaft is disposed on another side of the adjustable heat dissipation component. One end of the connecting component is connected to the adjustable heat dissipation component, another end of the connecting component is connected to the fixed substrate, and the connecting component can drive the adjustable heat dissipation component to rotate by using the rotating shaft. In the heat dissipation apparatus, the connecting component may be adjusted to rotate the electronic component together with the adjustable heat dissipation component, to reduce complexity in deploying the electronic component and the heat dissipation apparatus without affecting a heat dissipation effect, thereby improving convenience of operation.

In a possible implementation, a first heat dissipation fin column is disposed on the fixed substrate, and the first heat dissipation fin column includes a plurality of first heat dissipation fins. The first heat dissipation fins are mainly used to strengthen heat transfer. The fixed substrate may use a steel plate, a stainless steel plate, a copper tube, or the like. The first heat dissipation fins may also use steel plates, stainless steel plates, copper plates, aluminum plates, or the like. A greater heat transfer coefficient of the first heat dissipation fins indicates that the first heat dissipation fins have higher heat dissipation performance, so that a volume of heat dissipated by the heat dissipation apparatus can be increased. Other methods, for example, increasing a heat dissipation area of an outer wall, may be used to increase a flow velocity of air around the fin-type heat dissipation apparatus and improve an outgoing radiation strength of the heat dissipation apparatus.

In addition, in this embodiment of this application, the first heat dissipation fin column including the first heat dissipation fins is disposed on the fixed substrate. In this way, the volume of heat dissipated by the heat dissipation apparatus can be further increased, thereby efficiently dissipating heat of the electronic component and improving utility of the apparatus.

In a possible implementation, the adjustable heat dissipation component includes an adjustable heat dissipation substrate and a second heat dissipation fin column, the second heat dissipation fin column is disposed on the adjustable heat dissipation substrate, and the second heat dissipation fin column includes a plurality of second heat dissipation fins; and the second heat dissipation fins and the first heat dissipation fins are arranged in parallel, and the second heat dissipation fins and the first heat dissipation fins are mutually adjacent heat dissipation fins. The first heat dissipation fins and the second heat dissipation fins are arranged in a staggered manner and are maintained parallel to each other, so that collision or friction does not occur.

Furthermore, in this embodiment of this application, the second heat dissipation fin column including the second heat dissipation fins is disposed on the adjustable heat dissipation substrate, and each second heat dissipation fin is parallel to the first heat dissipation fins, to prevent the heat dissipation apparatus from being abraded because the heat dissipation fins collide with each other, thereby increasing a service life of the heat dissipation apparatus. Moreover, the second heat dissipation fins and the first heat dissipation fins are arranged adjacent to each other, and can further transfer heat, thereby improving heat dissipation efficiency.

In a possible implementation, a distance between the first heat dissipation fin and the second heat dissipation fin is greater than or equal to a critical distance, and the critical distance is a minimum distance at which the first heat dissipation fin and the second heat dissipation fin do not collide with each other. In actual application, a shortest possible distance between the first heat dissipation fin and the second heat dissipation fin is preferred provided that the first heat dissipation fin and the second heat dissipation fin do not collide with each other, because resistance of an air layer decreases as the distance shortens.

Further, in this embodiment of this application, the distance between the first heat dissipation fin and the second heat dissipation fin is further specified. The distance needs to be greater than or equal to the critical distance, and the critical distance is the minimum distance at which the first heat dissipation fin and the second heat dissipation fin do not collide with each other. In this way, a gap between two adjacent heat dissipation fins can be very small, and a smaller gap means smaller thermal resistance of the air layer and higher heat dissipation efficiency of the staggered heat dissipation fins.

In a possible implementation, the first heat dissipation fins each assume an arch shape that is high in the middle and low on two sides. Similarly, the second heat dissipation fins also each assume an arch shape that is high in the middle and low on two sides. The curved heat dissipation fins can ensure that a maximum staggering area exists between adjacent heat dissipation fins in an angle adjustment process.

Even further, in this embodiment of this application, the first heat dissipation fins and the second heat dissipation fins each use a design of an arch-shaped structure. In this design, a relatively large staggering area exists when the angle of the adjustable heat dissipation component is adjusted, and heat dissipation efficiency increases as the fin staggering area between the first heat dissipation fin and the second heat dissipation fin increases.

In a possible implementation, the rotating shaft is parallel to the fixed substrate, and a plane in which the rotating shaft is located is perpendicular to a plane in which the connecting component is located; and the rotating shaft is specifically disposed on each side of the adjustable heat dissipation component. Usually, the rotating shaft is located at a central location on each side of the adjustable heat dissipation substrate. This can ensure balance of the heat dissipation apparatus during rotation. In addition, if the plane in which the rotating shaft is located is perpendicular to the plane in which the connecting component is located, and the plane in which the rotating shaft is located is parallel to the fixed substrate, the connecting component is also perpendicular to the fixed substrate.

Moreover, in this embodiment of this application, the plane in which the rotating shaft is located is perpendicular to the plane in which the connecting component is located. This can maximize an acting force of the connecting component on the rotating shaft. In addition, the rotating shaft is disposed on each side of the adjustable heat dissipation component. This is favorable for maintaining stability of a heat dissipation structure.

In a possible implementation, the connecting component includes a nut and a screw; the nut is fixedly connected to the adjustable heat dissipation component, one end of the screw is connected to the fixed substrate, and the other end of the screw is connected to the nut; and an inner side of the nut is provided with an inner thread, an outer side of the screw is provided with an outer thread that coordinates with the inner thread, and a distance between one end of the adjustable heat dissipation component and the fixed substrate is increased or decreased through coordination between the nut and the screw. It can be understood that there are a plurality of manners for connecting the nut and the adjustable heat dissipation substrate. For example, an aperture is provided on the adjustable heat dissipation substrate, and the nut is inlaid into the aperture, to form a fixedly connected structure. Alternatively, the nut is fixed onto the adjustable heat dissipation substrate through welding.

Moreover, in this embodiment of this application, the nut of the connecting component is fixedly connected to the adjustable heat dissipation component, one end of the screw of the connecting component is connected to the fixed substrate, and the other end of the screw is connected to the nut. In this connection manner, the adjustable heat dissipation component may be controlled to rotate through mutual coordination between the screw and the nut, thereby improving feasibility of the solution.

In a possible implementation, a particular included angle exists between the adjustable heat dissipation substrate and a parallel surface of the fixed substrate in a rotation process of the adjustable heat dissipation substrate. A range of the included angle may be 0 degrees to 90 degrees. The adjustable heat dissipation substrate may be rotated by 90 degrees clockwise or may be rotated by 90 degrees counterclockwise. When the adjustable heat dissipation substrate is rotated by 90 degrees, it indicates that the adjustable heat dissipation substrate and the fixed substrate are perpendicular to each other.

Moreover, this embodiment of this application illustrates that the particular included angle further exists between the adjustable heat dissipation substrate and the parallel surface of the fixed substrate. The included angle is an angle by which the electronic component is adjusted according to an actual requirement, so that the heat dissipation apparatus has better adaptability during angle adjustment.

In a possible implementation, when considered from a perspective of utility, an angle range of the included angle may be specifically 0 degrees to 15 degrees.

Moreover, in this embodiment of this application, the range of the included angle between the adjustable heat dissipation substrate and the parallel surface of the fixed substrate may be 0 degrees to 15 degrees. In this way, a specific limitation is imposed when an angle of the electronic component is adjusted in an electronic device, thereby achieving proper angle adjustment and preventing cases such as collision with another component in the electronic device.

According to a second aspect, an embodiment of this application provides a heat dissipator, including an enclosure and the heat dissipation apparatus according to the first aspect, where the heat dissipation apparatus is disposed in the enclosure. The heat dissipation apparatus may be fixed onto the enclosure, or may be detachably connected to the enclosure. The heat dissipation apparatus includes an adjustable heat dissipation component, a fixed heat dissipation component, a rotating shaft, and a connecting component. The adjustable heat dissipation component includes an adjustable heat dissipation substrate and a plurality of second heat dissipation fins. The fixed heat dissipation component includes a fixed substrate and first heat dissipation fins. The connecting component includes a nut and a screw. An electronic component is fixed onto the adjustable heat dissipation substrate.

This embodiment of this application provides the heat dissipator. In the heat dissipator, the connecting component is adjusted to rotate the electronic component together with the adjustable heat dissipation component, to reduce complexity in deploying the electronic component and the heat dissipation apparatus without affecting a heat dissipation effect, thereby improving convenience of operation. In addition, the heat dissipator has an outer enclosure, so that the heat dissipator can be better deployed in an electronic device, to improve utility of the heat dissipation apparatus.

In a possible implementation, the enclosure includes a first outer enclosure and a second outer enclosure, and the first outer enclosure is connected to the fixed substrate in the heat dissipation apparatus by using a waterproof rubber strip, so that the first outer enclosure and the heat dissipation apparatus form a sealed structure. The second outer enclosure is detachably connected to the first outer enclosure, so that the heat dissipation apparatus can be conveniently adjusted and fetched.

Moreover, in this embodiment of this application, the heat dissipation apparatus is installed in the enclosure 60 together with the electronic component 50, and the first outer enclosure 601 included in the enclosure 60 is connected to the fixed substrate 201 by using the waterproof rubber strip 70, to implement a waterproof function of the heat dissipator, thereby improving utility of the solution.

According to a third aspect, an embodiment of this application provides an electronic device, including the heat dissipator according to the second aspect.

According to a fourth aspect, an embodiment of this application provides a heat dissipator control method. The method is dependent on the heat dissipation apparatus according to the first aspect, and the method specifically includes the following:

When a first acting force is exerted on a connecting component in the heat dissipation apparatus, the first acting force acts on an adjustable heat dissipation component. In this way, the heat dissipation apparatus can control the adjustable heat dissipation component to rotate in a first direction by using a rotating shaft, so that a distance between one end of the adjustable heat dissipation component and the fixed substrate is increased.

When a second acting force is exerted on the connecting component in the heat dissipation apparatus, the second acting force acts on the adjustable heat dissipation component. In this way, the heat dissipation apparatus can control the adjustable heat dissipation component to rotate in a second direction by using the rotating shaft, so that the distance between the one end of the adjustable heat dissipation component and the fixed substrate is decreased.

In this embodiment of this application, the heat dissipation control method is provided, so that the connecting component can be adjusted to control the adjustable heat dissipation component to rotate by using the rotating shaft. Usually, an electronic component may be deployed on the adjustable heat dissipation component, so that the electronic component rotates together with the adjustable heat dissipation component, to reduce complexity in deploying the electronic component and the heat dissipation apparatus without affecting a heat dissipation effect, thereby improving convenience of operation.

It can be learned from the foregoing technical solutions that the embodiments of this application have the following advantages:

In the embodiments of this application, the heat dissipation apparatus is provided. The heat dissipation apparatus includes the adjustable heat dissipation component, the fixed substrate, the rotating shaft, and the connecting component. The electronic component is disposed on one side of the adjustable heat dissipation component, and the rotating shaft is disposed on another side of the adjustable heat dissipation component. One end of the connecting component is connected to the adjustable heat dissipation component, another end of the connecting component is connected to the fixed substrate, and the connecting component can drive the adjustable heat dissipation component to rotate by using the rotating shaft. In the heat dissipation apparatus, the connecting component may be adjusted to rotate the electronic component together with the adjustable heat dissipation component, to reduce complexity in deploying the electronic component and the heat dissipation apparatus without affecting a heat dissipation effect, thereby improving convenience of operation.

BRIEF DESCRIPTION OF DRAWINGS

To describe the technical solutions in the embodiments of this application more clearly, the following briefly describes the accompanying drawings required for describing the embodiments. Apparently, the accompanying drawings in the following description show merely some embodiments of this application, and persons skilled in the art may still derive other drawings from these accompanying drawings.

DESCRIPTION OF EMBODIMENTS

Embodiments of this application provide a heat dissipation apparatus, a heat dissipator, an electronic device, and a heat dissipation control method, where a connecting component may be adjusted to rotate an electronic component together with an adjustable heat dissipation component, to reduce complexity in deploying the electronic component and the heat dissipation apparatus without affecting a heat dissipation effect, thereby improving convenience of operation.

In the specification, claims, and accompanying drawings of this application, the terms "first", "second", "third", "fourth", and so on (if existent) are intended to distinguish between similar objects but do not necessarily indicate a specific order or sequence. It should be understood that the data termed in such a way are interchangeable in proper circumstances so that the embodiments of the present invention described herein can be implemented in other orders than the order illustrated or described herein. Moreover, the terms "include", "have", and any variants thereof mean to cover non-exclusive inclusion. For example, a process, method, system, product, or device that includes a series of steps or units is not necessarily limited to those clearly listed steps or units, but may include other steps or units not expressly listed or inherent to such a process, method, product, or device.

It should be understood that, in the embodiments of this application, the electronic component may be fixedly connected to the heat dissipation apparatus directly, or may be fixedly connected to the heat dissipation apparatus by using a printed circuit board (PCB). The electronic component is a constituent part of the electronic device, and usually includes several elements. The electronic component may be universally applied to products of a same type.

It should be noted that the electronic component includes, but is not limited to, a resistor, a capacitor, a potentiometer, an electron tube, an electromechanical component, a connector, a discrete semiconductor device, an electric acoustic device, a laser device, an electronic display device, a photoelectric device, a sensor, a power supply, a switch, a small and special electrical machine, an electronic transformer, a relay, a PCB, an integrated circuit, a piezoelectric element, and the like.

Figure 1:
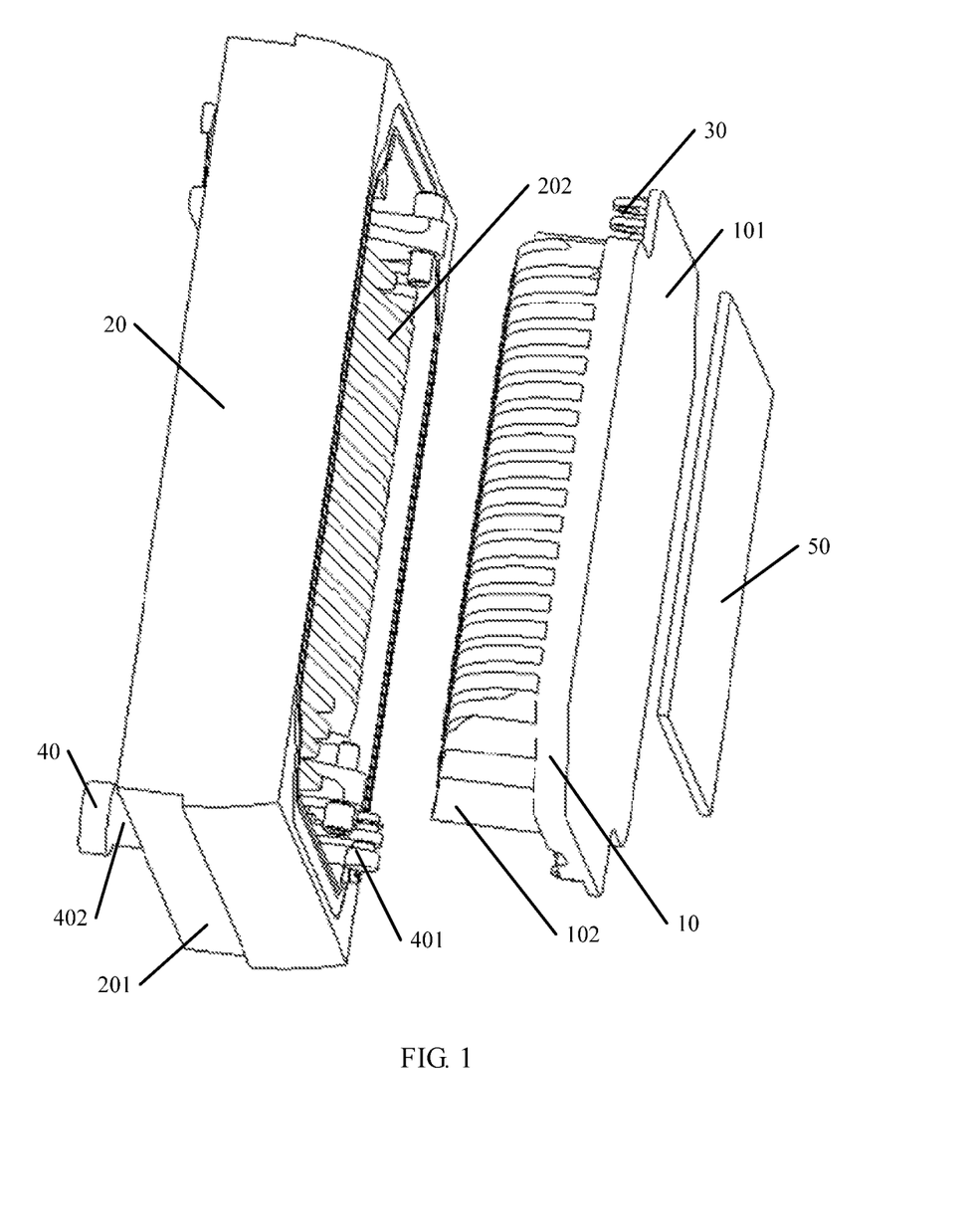
FIG. 1 is an exploded schematic structural diagram of a heat dissipation apparatus according to an embodiment of this application.

The following describes in detail the heat dissipation apparatus provided in this application. FIG. 1 is an exploded schematic structural diagram of a heat dissipation apparatus according to an embodiment of this application. Specifically, the heat dissipation apparatus includes an adjustable heat dissipation component 10, a fixed substrate 201, a rotating shaft 30, and a connecting component 40, where an electronic component 50 is disposed on one side of the adjustable heat dissipation component 10, and the rotating shaft 30 is disposed on another side of the adjustable heat dissipation component 10; and one end of the connecting component 40 is connected to the adjustable heat dissipation component 10, another end of the connecting component 40 is connected to the fixed substrate 201, and the connecting component 40 drives the adjustable heat dissipation component 10 to rotate by using the rotating shaft 30.

In this embodiment, the adjustable heat dissipation component 10 is mainly used to decrease a temperature of the electronic component 50 during operation, and the electronic component 50 is fixedly connected to the adjustable heat dissipation component 10. In other words, a contact surface between the electronic component 50 and the adjustable heat dissipation component 10 is also fixed. The contact surface between the electronic component 50 and the adjustable heat dissipation component 10 may need to be maximized, to achieve a better heat dissipation effect. The connecting component 40 acts as a "bridge", and is configured to connect the adjustable heat dissipation component 10 and the fixed substrate 201. As the term suggests, the fixed substrate 201 is relatively stationary. An angle of the adjustable heat dissipation component 10 relative to the fixed substrate 201 may be adjusted, to improve flexibility of the heat dissipation apparatus in use.

In actual application, the adjustable heat dissipation component 10 further needs support from the rotating shaft 30 in a rotation process. The rotation process is as follows: If an upward acting force is exerted on the connecting component 40, the rotating shaft 30 rotates counterclockwise because of the acting force. Because the rotating shaft 30 is fixedly connected to the adjustable heat dissipation component 10, the rotating shaft 30 that rotates counterclockwise drives the adjustable heat dissipation component 10 to rotate counterclockwise as well. If a downward acting force is exerted on the connecting component 40, the rotating shaft 30 rotates clockwise because of the acting force. Because the rotating shaft 30 is fixedly connected to the adjustable heat dissipation component 10, the rotating shaft 30 that rotates clockwise drives the adjustable heat dissipation component 10 to rotate clockwise as well.

In this embodiment of this application, the heat dissipation apparatus is provided. The heat dissipation apparatus includes the adjustable heat dissipation component, the fixed substrate, the rotating shaft, and the connecting component. The electronic component is disposed on one side of the adjustable heat dissipation component, and the rotating shaft is disposed on another side of the adjustable heat dissipation component. One end of the connecting component is connected to the adjustable heat dissipation component, another end of the connecting component is connected to the fixed substrate, and the connecting component can drive the adjustable heat dissipation component to rotate by using the rotating shaft. In the heat dissipation apparatus, the connecting component may be adjusted to rotate the electronic component together with the adjustable heat dissipation component, to reduce complexity in deploying the electronic component and the heat dissipation apparatus without affecting a heat dissipation effect, thereby improving convenience of operation.

Optionally, on a basis of the embodiment corresponding to FIG. 1, in a first optional embodiment of the heat dissipation apparatus provided in the embodiments of this application, a first heat dissipation fin column is disposed on the fixed substrate 201, and the first heat dissipation fin column includes a plurality of first heat dissipation fins 202.

In this embodiment, a row of heat dissipation fins is further fixed onto the fixed substrate 201. These heat dissipation fins are the first heat dissipation fins 202 in FIG. 1, and the plurality of first heat dissipation fins 202 constitute the first heat dissipation fin column.

The first heat dissipation fins 202 are additionally disposed on the fixed substrate 201, mainly intended to strengthen heat transfer. The fixed substrate 201 may use a steel plate, a stainless steel plate, a copper tube, or the like. The first heat dissipation fins 202 may also use steel plates, stainless steel plates, copper plates, aluminum plates, or the like. It can be understood that a greater heat transfer coefficient of the first heat dissipation fins 202 indicates that the first heat dissipation fins 202 have higher heat dissipation performance, so that a volume of heat dissipated by the heat dissipation apparatus can be increased. Other methods, for example, increasing a heat dissipation area of an outer wall, may be used to increase a flow velocity of air around the fin-type heat dissipation apparatus and improve an outgoing radiation strength of the heat dissipation apparatus.

In addition, in this embodiment of this application, the first heat dissipation fin column including the first heat dissipation fins 202 is disposed on the fixed substrate 201. In this way, the volume of heat dissipated by the heat dissipation apparatus can be further increased, thereby efficiently dissipating heat of the electronic component and improving utility of the apparatus.

Optionally, on a basis of the first embodiment corresponding to FIG. 1, in a second optional embodiment of the heat dissipation apparatus provided in the embodiments of this application, the adjustable heat dissipation component 10 includes an adjustable heat dissipation substrate 101 and a second heat dissipation fin column, the second heat dissipation fin column is disposed on the adjustable heat dissipation substrate 101, and the second heat dissipation fin column includes a plurality of second heat dissipation fins 102; and the second heat dissipation fins 102 and the first heat dissipation fins 202 are arranged in parallel, and the second heat dissipation fins 202 and the first heat dissipation fins 102 are mutually adjacent heat dissipation fins.

Figure 2:
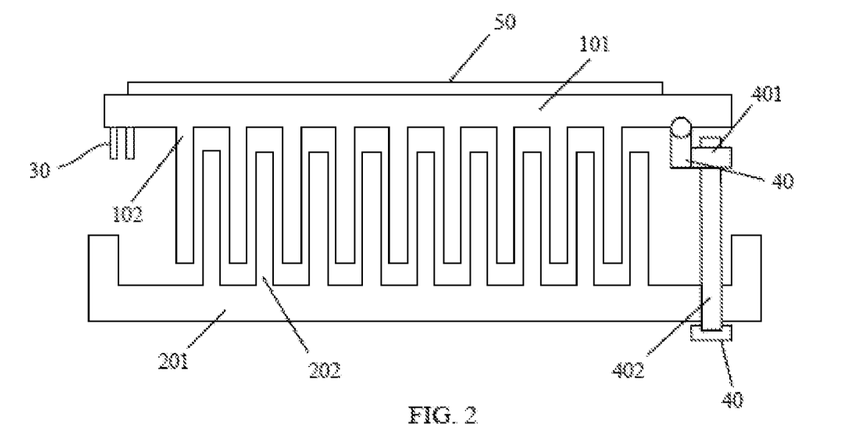
FIG. 2 is a front view of a heat dissipation apparatus according to an embodiment of this application.

In this embodiment, a manner of arrangement between the first heat dissipation fins 202 and the second heat dissipation fins 102 is further described in detail. FIG. 2 is a front view of the heat dissipation apparatus according to this embodiment of this application. As shown in the figure, the electronic component 50 is disposed on one side of the adjustable heat dissipation substrate 101, and the second heat dissipation fins 102 are disposed on another side of the adjustable heat dissipation substrate 101. Second heat dissipation fins 102 in a same row constitute the second heat dissipation fin column. Similarly, the first heat dissipation fins 202 are also disposed on the fixed substrate 201. In this way, the first heat dissipation fins 202 and the second heat dissipation fins 102 are arranged in a staggered manner and are maintained parallel to each other, so that collision or friction does not occur.

Furthermore, in this embodiment of this application, the second heat dissipation fin column including the second heat dissipation fins 102 is disposed on the adjustable heat dissipation substrate 101, and each second heat dissipation fin 102 is parallel to the first heat dissipation fins 202, to prevent the heat dissipation apparatus from being abraded because the heat dissipation fins collide with each other, thereby increasing a service life of the heat dissipation apparatus. Moreover, the second heat dissipation fins 202 and the first heat dissipation fins 102 are arranged adjacent to each other, and can further transfer heat, thereby improving heat dissipation efficiency.

Optionally, on a basis of the second embodiment corresponding to FIG. 1, in a third optional embodiment of the heat dissipation apparatus provided in the embodiments of this application, a distance between the first heat dissipation fin 202 and the second heat dissipation fin 102 is greater than or equal to a critical distance, and the critical distance is a minimum distance at which the first heat dissipation fin 202 and the second heat dissipation fin 102 do not collide with each other.

In this embodiment, a particular distance needs to be kept between each first heat dissipation fin 202 and an adjacent second heat dissipation fin 102. The distance is the critical distance, and the critical distance is the minimum distance at which the first heat dissipation fin 202 and the second heat dissipation fin 102 do not collide with each other. In actual application, a shortest possible distance between the first heat dissipation fin 202 and the second heat dissipation fin 102 is preferred provided that the first heat dissipation fin 202 and the second heat dissipation fin 102 do not collide with each other, because resistance of an air layer decreases as the distance shortens.

Further, in this embodiment of this application, the distance between the first heat dissipation fin 202 and the second heat dissipation fin 102 is further specified. The distance needs to be greater than or equal to the critical distance, and the critical distance is the minimum distance at which the first heat dissipation fin 202 and the second heat dissipation fin 102 do not collide with each other. In this way, a gap between two adjacent heat dissipation fins can be very small, and a smaller gap means smaller thermal resistance of the air layer and higher heat dissipation efficiency of the staggered heat dissipation fins.

Optionally, on a basis of the second or third embodiment corresponding to FIG. 1, in a fourth optional embodiment of the heat dissipation apparatus provided in the embodiments of this application, a shape of the first heat dissipation fin 202 and a shape of the second heat dissipation fin 102 are both arches.

Figure 3:
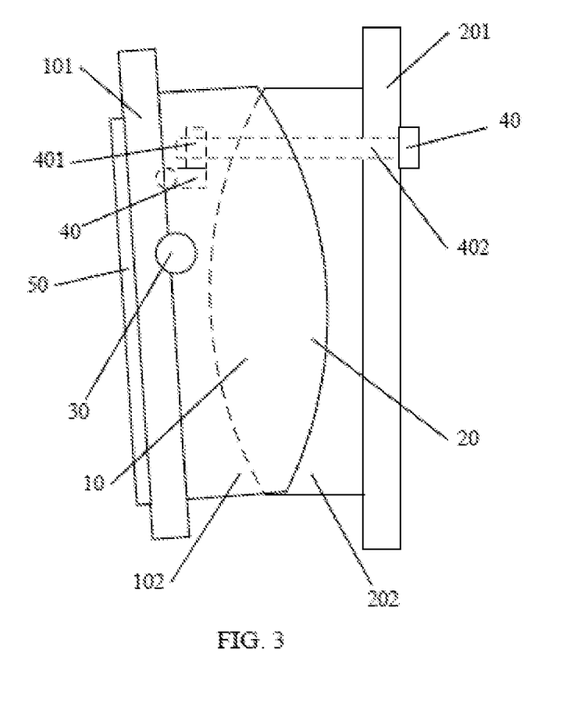
FIG. 3 is a side view of a heat dissipation apparatus according to an embodiment of this application.

In this embodiment, the shapes of the first heat dissipation fins 202 and the second heat dissipation fins 102 are described. FIG. 3 is a side view of the heat dissipation apparatus according to this embodiment of this application. As shown in the figure, the first heat dissipation fins 202 each assume an arch shape that is high in the middle and low on two sides. Similarly, the second heat dissipation fins 102 also each assume an arch shape that is high in the middle and low on two sides. The curved heat dissipation fins can ensure that a maximum staggering area exists between adjacent heat dissipation fins in an angle adjustment process.

It can be understood that a curve of an arch may be a part of a circle, or may be a part of a parabola or an ellipse. This is not limited herein.

Even further, in this embodiment of this application, the first heat dissipation fins 202 and the second heat dissipation fins 102 each use a design of an arch-shaped structure. In this design, a relatively large staggering area exists when the angle of the adjustable heat dissipation component 10 is adjusted, and heat dissipation efficiency increases as the fin staggering area between the first heat dissipation fin 202 and the second heat dissipation fin 102 increases.

Optionally, on a basis of the embodiment corresponding to FIG. 1, in a fifth optional embodiment of the heat dissipation apparatus provided in the embodiments of this application, the rotating shaft 30 is parallel to the fixed substrate 201, and a plane in which the rotating shaft 30 is located is perpendicular to a plane in which the connecting component 40 is located; and the rotating shaft 30 is disposed on each side of the adjustable heat dissipation component 10.

In this embodiment, a relationship between the rotating shaft 30 and each component in the heat dissipation apparatus is described. Specifically, refer to FIG. 2 again. FIG. 2 is the front view of the heat dissipation apparatus according to this embodiment of this application. As shown in the figure, the rotating shaft 30 is parallel to the fixed substrate 201. The rotating shaft 30 may be located at a central location on each side of the adjustable heat dissipation substrate 101. This can ensure balance of the heat dissipation apparatus during rotation. In addition, if the plane in which the rotating shaft 30 is located is perpendicular to the plane in which the connecting component 40 is located, and the plane in which the rotating shaft 30 is located is parallel to the fixed substrate 201, the connecting component 40 is also perpendicular to the fixed substrate 201.

Moreover, in this embodiment of this application, the plane in which the rotating shaft 30 is located is perpendicular to the plane in which the connecting component 40 is located. This can maximize an acting force of the connecting component 40 on the rotating shaft 30. In addition, the rotating shaft 30 is disposed on each side of the adjustable heat dissipation component 10. This is favorable for maintaining stability of a heat dissipation structure.

Optionally, on a basis of the embodiment corresponding to FIG. 1, in a sixth optional embodiment of the heat dissipation apparatus provided in the embodiments of this application, the connecting component 40 includes a nut 401 and a screw 402. The nut 401 is fixedly connected to the adjustable heat dissipation component 10, one end of the screw 402 is connected to the fixed substrate 201, and the other end of the screw 402 is connected to the nut 401. An inner side of the nut 401 is provided with an inner thread, an outer side of the screw 402 is provided with an outer thread that coordinates with the inner thread, and a distance between one end of the adjustable heat dissipation component 10 and the fixed substrate 201 is increased or decreased through coordination between the nut 401 and the screw 402.

In this embodiment, the connecting component 40 may specifically include the nut 401 and the screw 402. The nut 401 is fixedly connected to the adjustable heat dissipation component 10. Specifically, the nut 401 is fixedly connected to the adjustable heat dissipation substrate 101, one end of the screw 402 is connected to the fixed substrate 201, and the other end of the screw 402 is connected to the nut 401, thereby forming the connecting component 40.

It can be understood that there are a plurality of manners for connecting the nut 401 and the adjustable heat dissipation substrate 101. For example, an aperture is provided on the adjustable heat dissipation substrate 101, and the nut 401 is inlaid into the aperture, to form a fixedly connected structure. Alternatively, the nut 401 is fixed onto the adjustable heat dissipation substrate 101 through welding. In actual application, the nut 401 may be connected to the adjustable heat dissipation substrate 101 in other manners. The manners herein are merely intended for illustration, and should not be construed as limitations to this application.

Figure 4:
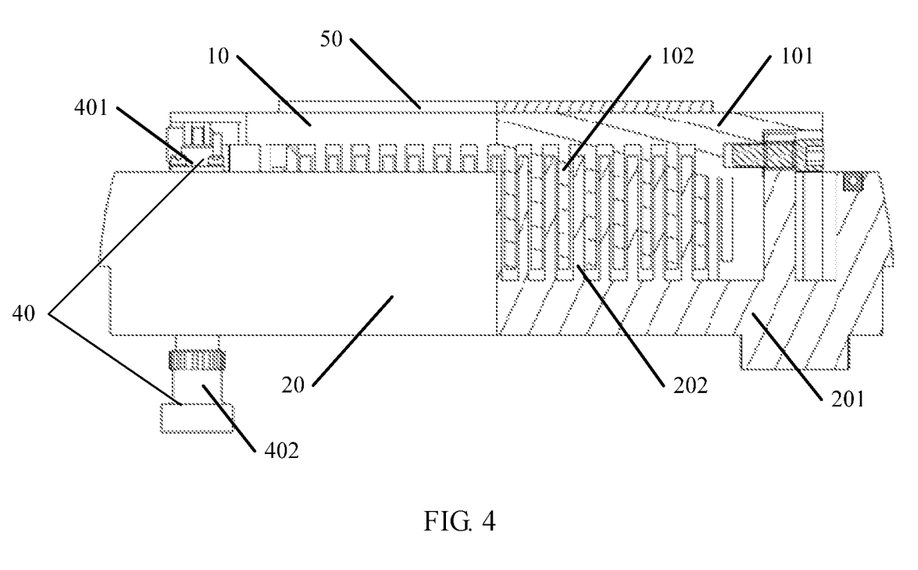
FIG. 4 is a schematic diagram of a local section of a heat dissipation apparatus according to an embodiment of this application.
Figure 5:
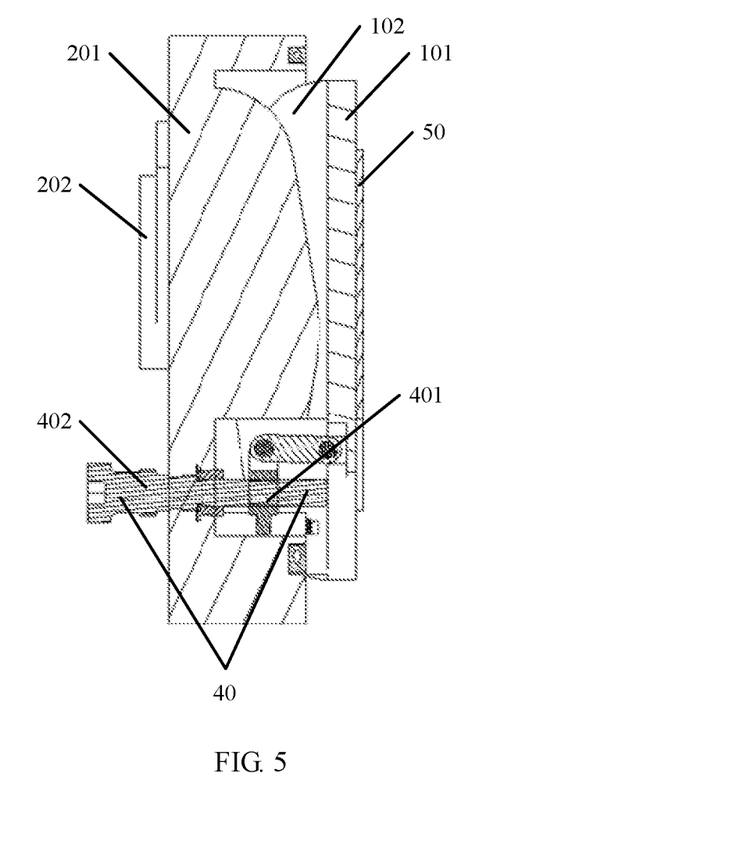
FIG. 5 is a schematic diagram of another local section of a heat dissipation apparatus according to an embodiment of this application.

For ease of description, refer to FIG. 4 and FIG. 5. FIG. 4 is a schematic diagram of a local section of the heat dissipation apparatus according to this embodiment of this application. FIG. 5 is a schematic diagram of another local section of the heat dissipation apparatus according to this embodiment of this application. As shown in the figures, one end of the screw 402 is connected to the nut 401, the other end of the screw 402 may be connected to a bolt, and the screw 402 may be driven to rotate by turning the bolt. The end that is of the screw 402 and that is connected to the nut 401 is provided with the outer thread, the nut 401 is provided with the inner thread, and the outer thread coordinates with the inner thread. The distance between the one end of the adjustable heat dissipation component 10 and the fixed substrate 201 may be increased by rotating the screw 402 in one direction. The distance between the one end of the adjustable heat dissipation component 10 and the fixed substrate 201 may be decreased by rotating the screw 402 in another direction.

Moreover, in this embodiment of this application, the nut 401 of the connecting component 40 is fixedly connected to the adjustable heat dissipation component 10, one end of the screw 402 of the connecting component 40 is connected to the fixed substrate 201, and the other end of the screw 402 is connected to the nut 401. In this connection manner, the adjustable heat dissipation component 10 may be controlled to rotate through mutual coordination between the screw 402 and the nut 401, thereby improving feasibility of the solution.

Optionally, on a basis of any one of the first to third embodiments corresponding to FIG. 1, in a seventh optional embodiment of the heat dissipation apparatus provided in the embodiments of this application, an included angle exists between the adjustable heat dissipation substrate 101 and a parallel surface of the fixed substrate 201.

In this embodiment, the particular included angle exists between the adjustable heat dissipation substrate 101 and the parallel surface of the fixed substrate 201 in a rotation process of the adjustable heat dissipation substrate 101. A range of the included angle may be 0 degrees to 90 degrees. The adjustable heat dissipation substrate 101 may be rotated by 90 degrees clockwise or may be rotated by 90 degrees counterclockwise. This is not limited herein. When the adjustable heat dissipation substrate 101 is rotated by 90 degrees, it indicates that the adjustable heat dissipation substrate 101 and the fixed substrate 201 are perpendicular to each other.

Moreover, this embodiment of this application illustrates that the particular included angle further exists between the adjustable heat dissipation substrate 101 and the parallel surface of the fixed substrate 201. The included angle is an angle by which the electronic component 50 is adjusted according to an actual requirement, so that the heat dissipation apparatus has better adaptability during angle adjustment.

Optionally, on a basis of the seventh embodiment corresponding to FIG. 1, in an eighth optional embodiment of the heat dissipation apparatus provided in the embodiments of this application, an angle range of the included angle is 0 degrees to 15 degrees.

In this embodiment, the particular included angle exists between the adjustable heat dissipation substrate 101 and the parallel surface of the fixed substrate 201 in the rotation process of the adjustable heat dissipation substrate 101. The adjustable heat dissipation substrate 101 may be rotated by 15 degrees clockwise or may be rotated by 15 degrees counterclockwise. Therefore, the range of the included angle may be specifically 0 degrees to 15 degrees.

Moreover, in this embodiment of this application, the range of the included angle between the adjustable heat dissipation substrate 201 and the parallel surface of the fixed substrate 101 may be 0 degrees to 15 degrees. In this way, a specific limitation is imposed when an angle of the electronic component 50 is adjusted in an electronic device, thereby achieving proper angle adjustment and preventing cases such as collision with another component in the electronic device.

Figure 6:
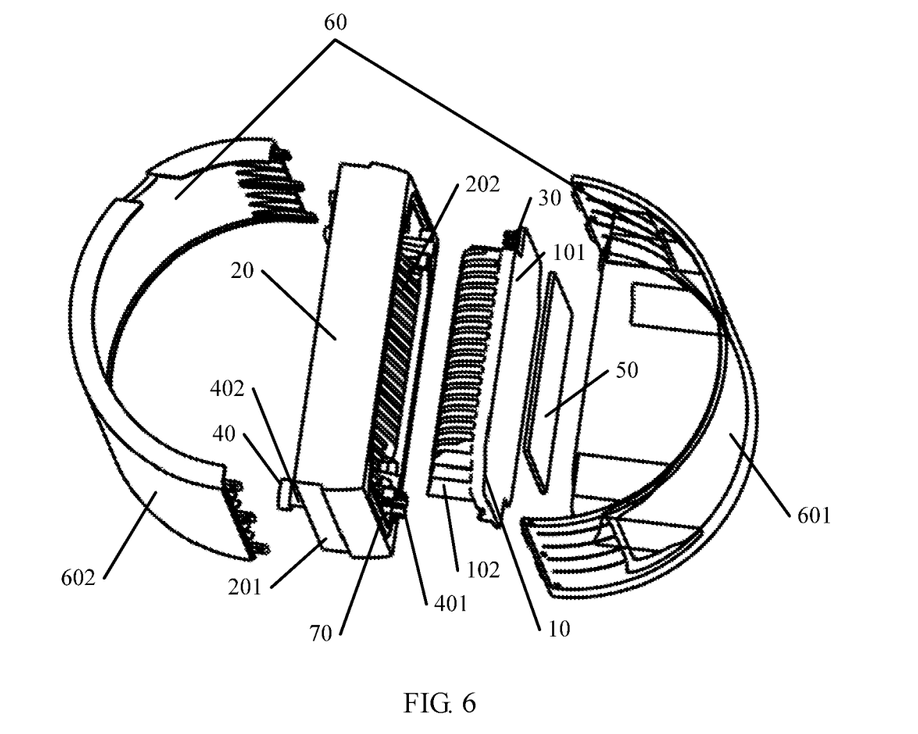
FIG. 6 is an exploded schematic structural diagram of a heat dissipator according to an embodiment of this application.

This application further provides a heat dissipator. The following describes the heat dissipator in detail. FIG. 6 is an exploded schematic structural diagram of a heat dissipator according to an embodiment of this application. As shown in the figure, specifically, the heat dissipator includes an enclosure and a heat dissipation apparatus. The heat dissipation apparatus is the heat dissipation apparatus according to any one of FIG. 1 and the first to eighth embodiments corresponding to FIG. 1. The heat dissipation apparatus is disposed in the enclosure 60.

In this embodiment, the heat dissipation apparatus may be fixed onto the enclosure 60, or may be detachably connected to the enclosure 60. The heat dissipation apparatus includes an adjustable heat dissipation component 10, a fixed heat dissipation component 20, a rotating shaft 30, and a connecting component 40. The adjustable heat dissipation component 10 includes an adjustable heat dissipation substrate 101 and a plurality of second heat dissipation fins 102. The fixed heat dissipation component 20 includes a fixed substrate 201 and first heat dissipation fins 202. The connecting component 40 includes a nut 401 and a screw 402. An electronic component 50 is fixed onto the adjustable heat dissipation substrate 101.

The first heat dissipation fins 202 and the second heat dissipation fins 102 are configured in a staggered manner. To be specific, an arrangement manner is that one second heat dissipation fin 102 is included between every two first heat dissipation fins 202, and similarly, one first heat dissipation fin 202 is included between every two second heat dissipation fins 102, to transfer heat between the fins. Finally, the heat is transferred to an environment by using the fixed substrate 201.

The coordination between the nut 401 and the screw 402 may be used to adjust a rotation angle of the adjustable heat dissipation component 10. To be specific, the screw 402 is rotated in one direction, so that the nut 401 may rotate upward or rotate downward along the screw 402, to drive the adjustable heat dissipation component 10 to rotate by using the rotating shaft 30, thereby adjusting the angle of the adjustable heat dissipation component 10.

Optionally, on a basis of the embodiment corresponding to FIG. 6, in a first optional embodiment of the heat dissipator provided in the embodiments of this application, the enclosure 60 includes a first outer enclosure 601 and a second outer enclosure 602, the first outer enclosure 601 is connected to the fixed substrate 201 in the heat dissipation apparatus by using a waterproof rubber strip 70, and the second outer enclosure 602 is detachably connected to the first outer enclosure 601.

In this embodiment, a waterproof heat dissipator structure is designed. Specifically, the first enclosure 601 in the enclosure 60 is connected to the fixed substrate 201 in the heat dissipation apparatus, the first enclosure 601 covers the electronic component 50, and the first enclosure 601 is connected to the fixed substrate 20 by using the waterproof rubber strip 70. The waterproof rubber strip 70 may be disposed on an edge of the entire fixed substrate 201, so that the first outer enclosure 601 and the heat dissipation apparatus form a sealed structure.

In addition, in actual application, the heat dissipator further needs a complete outer enclosure. To be specific, the first outer enclosure 601 and the second outer enclosure 602 are spliced, to form a complete heat dissipator. It should be noted that there are a plurality of methods for splicing the first outer enclosure 601 and the second outer enclosure 602. Fixed splicing may be used, or detachable splicing may be used. This is not limited herein.

Moreover, in this embodiment of this application, the heat dissipation apparatus is installed in the enclosure 60 together with the electronic component 50, and the first outer enclosure 601 included in the enclosure 60 is connected to the fixed substrate 201 by using the waterproof rubber strip 70, to implement a waterproof function of the heat dissipator, thereby improving utility of the solution.

Based on the foregoing embodiments, this application further provides an electronic device. The electronic device includes at least one heat dissipator described in FIG. 6. Specifically, this type of electronic device may be a communications device, may be a production device, or may be a device of another type. This is not limited herein.

Figure 7:
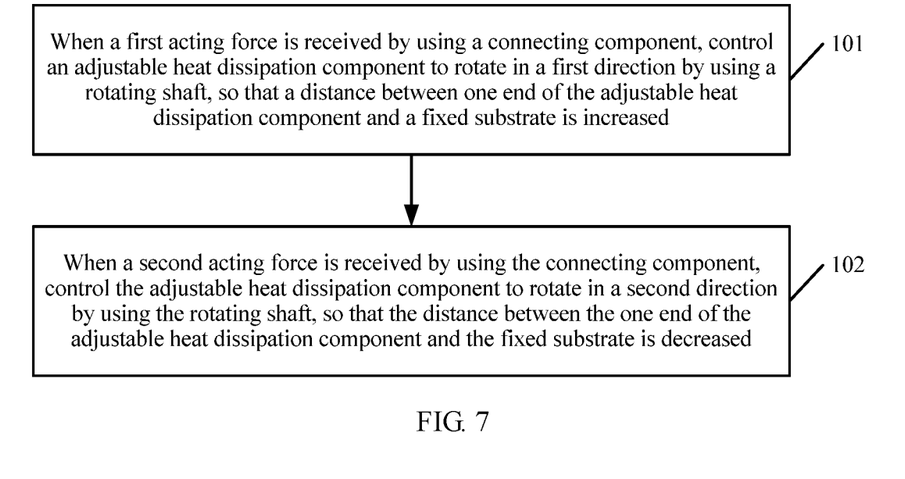
FIG. 7 is a schematic diagram of an embodiment of a heat dissipation control method according to the embodiments of this application.

The embodiments shown in FIG. 1 to FIG. 6 describe in detail the specific structure of the heat dissipation apparatus. The following describes in detail a heat dissipation control method that is based on the heat dissipation apparatus with reference to the embodiment shown in FIG. 6. FIG. 7 is a schematic diagram of an embodiment of a heat dissipation control method according to the embodiments of this application. As shown in the figure, the heat dissipation control method includes the following steps.

101. When a first acting force is received by using a connecting component, control an adjustable heat dissipation component to rotate in a first direction by using a rotating shaft, so that a distance between one end of the adjustable heat dissipation component and a fixed substrate is increased.

In this embodiment, when the first acting force is exerted on the connecting component in the heat dissipation apparatus, the first acting force acts on the adjustable heat dissipation component. In this way, the heat dissipation apparatus can control the adjustable heat dissipation component to rotate in the first direction by using the rotating shaft, so that the distance between the one end of the adjustable heat dissipation component and the fixed substrate is increased.

Specifically, the first acting force may be a force generated through coordination between a nut and a screw in the connecting component. For example, the screw is rotated, so that the screw generates an upward first acting force. After the upward first acting force is exerted on one side of the adjustable heat dissipation component, the rotating shaft also rotates counterclockwise because of the acting force. The rotating shaft and the adjustable heat dissipation component are fixedly connected. Therefore, the rotating shaft that rotates counterclockwise drives the adjustable heat dissipation component to rotate counterclockwise as well. In this case, the first direction may be considered as a counterclockwise direction.

It should be noted that, in actual application, the first acting force may alternatively be a downward acting force. In this case, the first direction may be considered as a clockwise direction. This is merely intended for illustration and should not be construed as a limitation to this application.

102. When a second acting force is received by using the connecting component, control the adjustable heat dissipation component to rotate in a second direction by using the rotating shaft, so that the distance between the one end of the adjustable heat dissipation component and the fixed substrate is decreased.

In this embodiment, when the second acting force is exerted on the connecting component in the heat dissipation apparatus, the second acting force acts on the adjustable heat dissipation component. In this way, the heat dissipation apparatus can control the adjustable heat dissipation component to rotate in the second direction by using the rotating shaft, so that the distance between the one end of the adjustable heat dissipation component and the fixed substrate is decreased.

Specifically, the second acting force may be a force generated through the coordination between the nut and the screw in the connecting component. For example, the screw is rotated, so that the screw generates a downward second acting force. After the upward second acting force is exerted on one side of the adjustable heat dissipation component, the rotating shaft also rotates clockwise because of the acting force. The rotating shaft and the adjustable heat dissipation component are fixedly connected. Therefore, the rotating shaft that rotates clockwise drives the adjustable heat dissipation component to rotate clockwise as well. In this case, the second direction may be considered as a clockwise direction.

It should be noted that, in actual application, the second acting force may alternatively be an upward acting force. In this case, the second direction may be considered as a counterclockwise direction. This is merely intended for illustration and should not be construed as a limitation to this application.

It can be understood that a direction of the first acting force is opposite to a direction of the second acting force, and the first direction is also opposite to the second direction.

In this embodiment of this application, the heat dissipation control method is provided, so that the connecting component can be adjusted to control the adjustable heat dissipation component to rotate by using the rotating shaft. Usually, an electronic component may be deployed on the adjustable heat dissipation component, so that the electronic component rotates together with the adjustable heat dissipation component, to reduce complexity in deploying the electronic component and the heat dissipation apparatus without affecting a heat dissipation effect, thereby improving convenience of operation.

It may be clearly understood by persons skilled in the art that, for the purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and there may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit. The integrated unit may be implemented in a form of hardware, or may be implemented in a form of a software functional unit.

The foregoing embodiments are examples and merely intended for describing the technical solutions of this application, but not for limiting this application. Although this application is described in detail with reference to the foregoing example embodiments, persons of ordinary skill in the art should understand that they may still make modifications to the technical solutions described in the foregoing example embodiments or make equivalent replacements to some technical features thereof, without departing from the spirit and scope of the technical solutions of the example embodiments of this application.

What is claimed is:

1. A heat dissipation apparatus, comprising an adjustable heat dissipation component, a fixed substrate, a rotating shaft, and a connecting component, wherein
    an electronic component is disposed on one side of the adjustable heat dissipation component, and the rotating shaft is disposed on another side of the adjustable heat dissipation component; and
    one end of the connecting component is connected to the adjustable heat dissipation component, another end of the connecting component is connected to the fixed substrate, and the connecting component is configured to drive the adjustable heat dissipation component to rotate by using the rotating shaft,
    wherein a first heat dissipation fin column is disposed on the fixed substrate, and the first heat dissipation fin column comprises a plurality of first heat dissipation fins.

2. The heat dissipation apparatus according to claim 1, wherein the adjustable heat dissipation component comprises an adjustable heat dissipation substrate and a second heat dissipation fin column, the second heat dissipation fin column is disposed on the adjustable heat dissipation substrate, and the second heat dissipation fin column comprises a plurality of second heat dissipation fins; and
    the plurality of second heat dissipation fins and the plurality of first heat dissipation fins are arranged in parallel, and the plurality of second heat dissipation fins and the plurality of first heat dissipation fins are mutually adjacent heat dissipation fins.

3. The heat dissipation apparatus according to claim 2, wherein a distance between each of the first plurality of heat dissipation fins and one of the second plurality of heat dissipation fins next to the first heat dissipation fin is greater than or equal to a critical distance, and the critical distance is a minimum distance at which the first heat dissipation fin and the one of the second plurality of heat dissipation fin next to the first heat dissipation fin do not collide with each other.

4. The heat dissipation apparatus according to claim 2, wherein the plurality of first heat dissipation fins and the plurality of second heat dissipation fins are arches.

5. The heat dissipation apparatus according to claim 1, wherein the rotating shaft is parallel to the fixed substrate, and a plane in which the rotating shaft is located is perpendicular to a plane in which the connecting component is located; and
    the rotating shaft is disposed on at least one side of the adjustable heat dissipation component.

6. A heat dissipation apparatus, comprising an adjustable heat dissipation component, a fixed substrate, a rotating shaft, and a connecting component, wherein
    an electronic component is disposed on one side of the adjustable heat dissipation component, and the rotating shaft is disposed on another side of the adjustable heat dissipation component; and
    one end of the connecting component is connected to the adjustable heat dissipation component, another end of the connecting component is connected to the fixed substrate, and the connecting component is configured to drive the adjustable heat dissipation component to rotate by using the rotating shaft;
    wherein the connecting component comprises a nut and a screw;

the nut is fixedly connected to the adjustable heat dissipation component, one end of the screw is connected to the fixed substrate, and the other end of the screw is connected to the nut; and an inner side of the nut is operatively coupled to the screw, and a distance between one end of the adjustable heat dissipation component and the fixed substrate is increased or decreased through coordination between the nut and the screw.

7. The heat dissipation apparatus according to claim 1, wherein the adjustable heat dissipation substrate and a plane in which the fixed substrate is located form an included angle.

8. The heat dissipation apparatus according to claim 7, wherein an angle range of the included angle is 0 degrees to 15 degrees.

9. A heat dissipator, comprising an enclosure and a heat dissipation apparatus, wherein the heat dissipation apparatus is disposed in the enclosure;

the heat dissipation apparatus comprises an adjustable heat dissipation component, a fixed substrate, a rotating shaft, and a connecting component, an electronic component is disposed on one side of the adjustable heat dissipation component, and the rotating shaft is disposed on another side of the adjustable heat dissipation component; and one end of the connecting component is connected to the adjustable heat dissipation component, another end of the connecting component is connected to the fixed substrate, and the connecting component is configured to drive the adjustable heat dissipation component to rotate by using the rotating shaft;

wherein a first heat dissipation fin column is disposed on the fixed substrate, and the first heat dissipation fin column comprises a plurality of first heat dissipation fins.

10. The heat dissipator according to claim 9, wherein the adjustable heat dissipation component comprises an adjustable heat dissipation substrate and a second heat dissipation fin column, the second heat dissipation fin column is disposed on the adjustable heat dissipation substrate, and the second heat dissipation fin column comprises a plurality of second heat dissipation fins; and the plurality of second heat dissipation fins and the plurality of first heat dissipation fins are arranged in parallel, and the plurality of second heat dissipation fins and the first heat dissipation fins are mutually adjacent heat dissipation fins.

11. The heat dissipator according to claim 10, wherein a distance between each of the plurality of first heat dissipation fins and one of the plurality of second heat dissipation fins next to the first heat dissipation fin is greater than or equal to a critical distance, and the critical distance is a minimum distance at which the first heat dissipation fin and the one of the plurality of second heat dissipation fin next to the first heat dissipation fin do not collide with each other.

12. The heat dissipator according to claim 11, wherein the first plurality of heat dissipation fins and the second plurality of heat dissipation fins are arches.

13. The heat dissipator according to claim 9, wherein the rotating shaft is parallel to the fixed substrate, and a plane in which the rotating shaft is located is perpendicular to a plane in which the connecting component is located; and the rotating shaft is disposed on at least one side of the adjustable heat dissipation component.

14. A heat dissipator, comprising an enclosure and a heat dissipation apparatus, wherein the heat dissipation apparatus is disposed in the enclosure:

the heat dissipation apparatus comprises an adjustable beat dissipation component, a fixed substrate, a rotating shaft, and a connecting component, an electronic component is disposed on one side of the adjustable heat dissipation component, and the rotating shaft is disposed on another side of the adjustable heat dissipation component, and one end of the connecting component is connected to the adjustable heat dissipation component, another end of the connecting component is connected to the fixed substrate, and the connecting component is configured to drive the adjustable heat dissipation component to rotate by using the rotating shaft;

wherein the connecting component comprises a nut and a screw;

the nut is fixedly connected to the adjustable heat dissipation component, one end of the screw is connected to the fixed substrate, and the other end of the screw is connected to the nut; and an inner side of the nut is operatively coupled to the screw, and a distance between one end of the adjustable heat dissipation component and the fixed substrate is increased or decreased through coordination between the nut and the screw.

15. The heat dissipator according to claim 9, wherein the adjustable heat dissipation substrate and a plane in which the fixed substrate is located form an included angle.

16. The heat dissipator according to claim 15, wherein an angle range of the included angle is 0 degrees to 15 degrees.

17. A heat dissipator, comprising an enclosure and a heat dissipation apparatus, wherein the heat dissipation apparatus is disposed in the enclosure:

the heat dissipation apparatus comprises an adjustable heat dissipation component, a fixed substrate, a rotating shaft, and a connecting component, an electronic component is disposed on one side of the adjustable heat dissipation component, and the rotating shaft is disposed on another side of the adjustable heat dissipation component; and one end of the connecting component is connected to the adjustable heat dissipation component, another end of the connecting component is connected to the fixed substrate, and the connecting component is configured to drive the adjustable heat dissipation component to rotate by using the rotating shaft;

wherein the enclosure comprises a first outer enclosure and a second outer enclosure, the first outer enclosure is connected to a fixed substrate in the heat dissipation apparatus by using a waterproof rubber strip, and the second outer enclosure is detachably connected to the first outer enclosure.

18. A heat dissipation control method performed by a heat dissipation apparatus including an adjustable heat dissipation component, a fixed substrate, a rotating shaft disposed on one side of the adjustable heat dissipation component opposing to a side on which an electronic component is disposed, and a connecting component, one end of the connecting component being connected to the adjustable heat dissipation component, another end of the connecting component being connected to the fixed substrate, and the connecting component driving the adjustable heat dissipation component to rotate by using the rotating shaft, comprising:

when a first acting force is received via the connecting component, controlling the adjustable heat dissipation component to rotate in a first direction by using the rotating shaft, so that a distance between one end of the adjustable heat dissipation component and the fixed substrate is increased; and when a second acting force is received via the connecting component, controlling the adjustable heat dissipation component to rotate in a second direction by using the rotating shaft, so that the distance between the one end of the adjustable heat dissipation component and the fixed substrate is decreased, wherein a first heat dissipation fin column is disposed on the fixed substrate, and the first beat dissipation tin column comprises a plurality of first heat dissipation fins.

19. The heat dissipation apparatus according to claim 1, wherein the electronic component is disposed on the adjustable heat dissipation component, and the electronic component contacts the one side of the adjustable heat dissipation component.

\* \* \* \* \*

UNITED STATES PATENT AND TRADEMARK OFFICE
CERTIFICATE OF CORRECTION

PATENT NO. : 11,432,432 B2
APPLICATION NO. : 16/663567
DATED : August 30, 2022
INVENTOR(S) : Ying Dong It is certified that error appears in the above-identified patent and that said Letters Patent is hereby corrected as shown below:

In the Claims

Column 18, Line 5, Claim 14 change:
beat dissipation component, ...
To:
heat dissipation component, ...

Column 19, Line 14, Claim 18 change:
..., and the first beat dissipation tin
To:
..., and the first heat dissipation fin

Signed and Sealed this
Eleventh Day of October, 2022

*Katherine Kelly Vidal*

Katherine Kelly Vidal
*Director of the United States Patent and Trademark Office*